(12) United States Patent
Gantioler et al.

(10) Patent No.: US 6,404,041 B1
(45) Date of Patent: Jun. 11, 2002

(54) EMC-OPTIMIZED POWER SWITCH

(75) Inventors: Josef-Matthias Gantioler, München; Frank Klotz, Müchen; Martin März, Markt Schwaben, all of (DE); Helmut Gassel, Farmington Hills, MI (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/420,461

(22) Filed: Oct. 18, 1999

Related U.S. Application Data

(63) Continuation of application No. PCT/DE99/00193, filed on Jan. 26, 1999.

(30) Foreign Application Priority Data

Feb. 18, 1998 (DE) .......................................... 198 06 817

(51) Int. Cl.⁷ .............................................. H01L 23/495
(52) U.S. Cl. ........................ 257/666; 257/676; 257/724; 361/813
(58) Field of Search ................................ 257/666, 676, 257/724; 438/123; 361/813

(56) References Cited

U.S. PATENT DOCUMENTS

| | | | |
|---|---|---|---|
| 3,986,196 A | 10/1976 | Decker et al. | 257/280 |
| 4,961,107 A | 10/1990 | Geist et al. | 257/676 |
| 5,212,402 A | * 5/1993 | Higgins, III | 257/532 |
| 5,581,118 A | * 12/1996 | Mays | 257/666 |

FOREIGN PATENT DOCUMENTS

| | | | |
|---|---|---|---|
| DE | 69111738 T2 | 8/1995 | |
| EP | 0098167 A2 | 1/1984 | |
| EP | 0472357 A2 | 2/1992 | |
| EP | 0671769 A2 | 9/1995 | |
| EP | 0696818 A2 | 2/1996 | |
| JP | 8-204083 | * 8/1996 | 257/666 |

OTHER PUBLICATIONS

"Semiconductor Devices, Physics and Technology" pp. 200–207, S.M. Sze.*

* cited by examiner

Primary Examiner—Jhihan B Clark
(74) Attorney, Agent, or Firm—Herbert L. Lerner; Laurence A. Greenberg; Werner H. Stemer

(57) ABSTRACT

The power switch has considerably reduced common-mode interference and relatively reduced circuit complexity. The power switch is formed of a semiconductor chip on a leadframe. A first terminal of the semiconductor chip is connected to the active potential and a second terminal for inactive potential is connected to the leadframe. The second terminal is either the drain of a transistor or the anode of a diode.

4 Claims, 2 Drawing Sheets

EMC-OPTIMIZED POWER SWITCH

CROSS-REFERENCE TO RELATED APPLICATION

This is a continuation of copending International Application PCT/DE99/00193, filed Jan. 26, 1999, which designated the United States.

BACKGROUND OF THE INVENTION

Field of the Invention

The invention lies in the electrical arts. Specifically, the present invention relates to a power switch of the type disclosed in the commonly assigned U.S. Pat. No. 5,821,618 (see European patent application EP 0 696 818). The reference describes a semiconductor chip on a leadframe. The semiconductor chip has at least one gate terminal, one first terminal for an active potential and one second terminal for an inactive potential. The leadframe is connected to the second terminal.

Power switchs, in particular power transistors, which operate on the basis of fast switching processes cause a high level of electromagnetic interference emission. In order to comply with the maximum interference emission limits specified in the relevant EMC Standards (for example, EN50081 11/2), a quite considerable filter complexity is therefore required in most practical circuits.

With regard to conducted interference, a distinction is drawn between differential-mode and common-mode interference, with common-mode interference being caused by the interference currents coupled into the ground or frame path. The origin of common-mode interference will be explained in the following text with reference to a single-ended converter.

If the power switch is a power MOS transistor, then high voltages occur at the drain terminal of the power transistor during switching operation, that is to say the voltage profile has a steep gradient dU/dt. Since, in all power transistors according to the prior art, the rear side of the chip facing the heatsink forms the drain terminal and is connected to the leadframe, this results, when the component is mounted on a heatsink, in a considerable coupling capacitance $C_k$ between the drain and the heatsink. (The leadframe, of course, is the metal base on which the actual semiconductor chip is mounted.) The heatsink itself is generally connected to frame potential directly or via a coupling capacitance, which is not insignificant owing to its physical extent. An interference current which is proportional to the rate of voltage change, that is to say, $I_{int} \sim C_k \cdot dU/dt$, is now coupled into the frame line via the coupling capacitance $C_k$.

That situation is illustrated in FIG. 2 (see U.S. Pat. No. 4,961,107). A power transistor 6 according to the prior art has its drain terminal connected directly to the leadframe 2. A load 4 is connected in the drain path of the power transistor 6. A capacitance $C_K$ is formed by the leadframe 2 and the heatsink 1 with insulation 9 between the two, via which capacitance $C_K$ the power switch is capacitively coupled to frame and via which an interference current $I_{int}$ is coupled into the frame line. Owing to the large area of the leadframe, the capacitance $C_K$ assumes a large value, as a result of which the current $I_{int}$ coupled into the frame line is also large.

After the coupling process, these common-mode current elements can be removed from the frame line only with great difficulty; for example, in mains-powered appliances, the size of the Y-capacitors required to filter out the common-mode interference is severely limited by considerations relating to the maximum dissipation current, thus leading to increased complexity for current-compensated suppression inductors.

In order to suppress the occurrence of common-mode interference, the prior art uses a conductive shield between the transistor and the heatsink, and the shield is connected with low inductance to the intermediate circuit potential. The interference current path to frame is thus interrupted.

However, the disadvantages of this suppression method are that the assembly complexity is considerably increased and the thermal resistance between the transistor and the heatsink is increased.

SUMMARY OF THE INVENTION

It is accordingly an object of the invention to provide an EMC-optimized power switch, which overcomes the above-mentioned disadvantages of the heretofore-known devices and methods of this general type and which suppresses common-mode interference, and at the same time reduces the circuit complexity.

With the foregoing and other objects in view there is provided, in accordance with the invention, a power switch, comprising:

a leadframe;

a semiconductor chip on the leadframe; and a transistor formed on the semiconductor chip, the transistor having a drain forming a first terminal for an active potential and having a source forming a second terminal connected to the leadframe for an inactive potential.

In other words, the basic premise of the invention is that the leadframe of the power switch is connected to that side of the chip which is at the "inactive potential."

The term "inactive potential" as used herein means the potential which is present on the side of the power switch facing away from the load. The "active potential," on the other hand, is that potential which is present on the load side of the power switch.

In the power switch according to the invention, which comprises a semiconductor chip on a leadframe, in which case the semiconductor chip has at least one first terminal for an active potential and one second terminal for an inactive potential. The leadframe is connected to the second terminal. In the embodiment in which the chip carries a transistor switch, the first terminal is the drain, and the second terminal is the source, of the transistor. The chip can in this case be completely insulated from the leadframe, and the terminal between the source and the leadframe is produced by a wire link.

In accordance with an added feature of the invention, the semiconductor chip is mounted on the leadframe via a source of the transistor. Since the chip is mounted on the leadframe via the source terminal, the drain terminal is located on the exposed surface of the chip.

In accordance with an additional feature of the invention, the semiconductor chip has an exposed surface and trenches formed therein, and wherein the transistor has a gate terminal connected to the exposed surface of the semiconductor chip via the trenches in the semiconductor chip. Since, in this embodiment, the gate (which is arranged adjacent to the source) is likewise located on the side of the leadframe, the gate terminal is connected to the exposed surface of the chip via the trenches in the chip. It is thus accessible and can be wired up.

With the above and other objects in view there is provided, in accordance with the invention, a power switch which is configured with a diode. Similarly to the above embodiment, the device has a semiconductor chip on a leadframe. The diode has a cathode forming the first terminal for an active potential and an anode for the inactive potential. The leadframe is connected to the anode.

Such an EMC-optimized switch has the following advantages: firstly, common-mode interference elements are suppressed without any additional shield. Secondly, the thermal resistance is not increased by shield insulation. Finally, owing to the lack of source bonding wires, the transistors have an extremely low source inductance. This effectively reduces parasitic oscillations in the area of the switching flanks—particularly when a plurality of transistors are connected in parallel. These oscillations are evident as maxima in the interference spectrum, whose attenuation in transistors according to the prior art (common drain) involves considerably increased complexity (auxiliary source terminal, resistors on the gate and source sides for the gate driver, etc.), which is obviated with the transistor according to the invention.

Other features which are considered as characteristic for the invention are set forth in the appended claims.

Although the invention is illustrated and described herein as embodied in an EMC-optimized power switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in terminal with the accompanying drawings.

DESCRIPTION OF THE PREFERRED EMBODIMENTS

Figure 1:
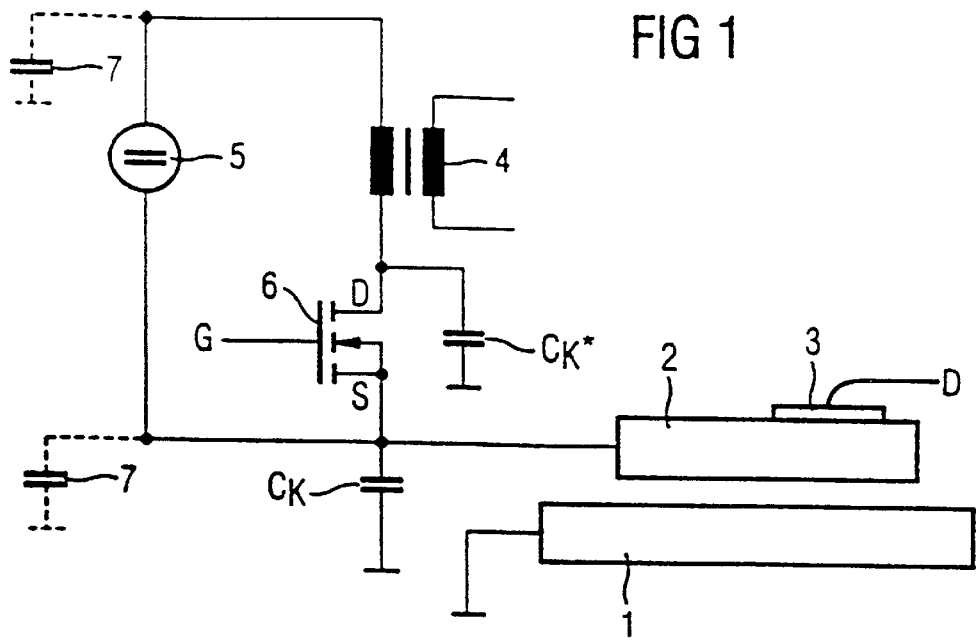
FIG. 1 is a schematic diagram of an embodiment of the shielded power switch according to the invention.
Figure 2:
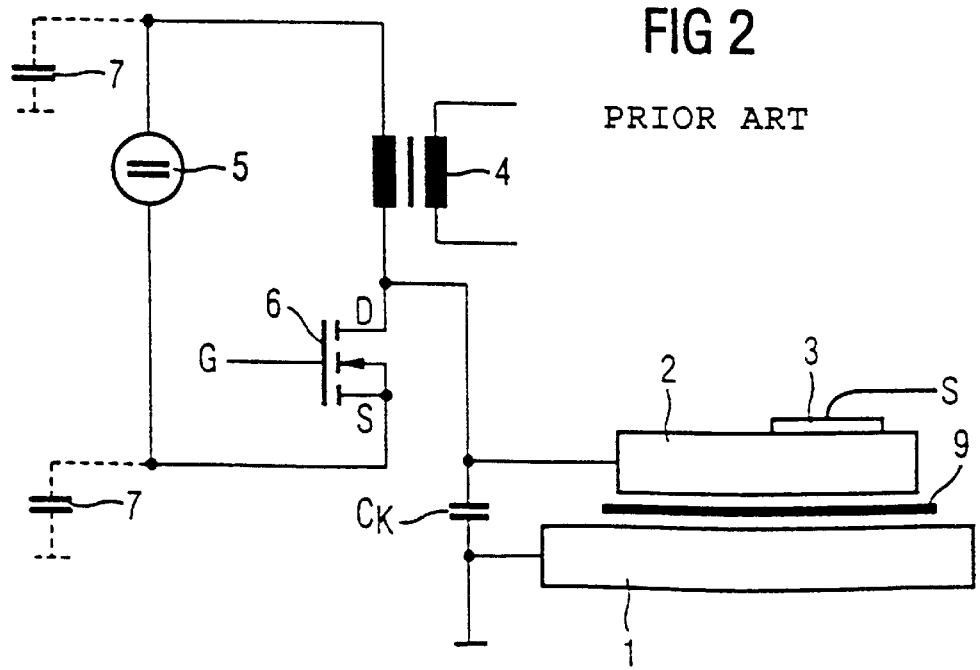
FIG. 2 is a similar view of a related prior art device.

Referring now to the figures of the drawing in detail and first, particularly, to FIG. 1 thereof, there is illustrated both the structural configuration and the circuit schematic of a power switch 6. The right-hand portion of FIG. 1 shows the power switch 6 as comprising a chip 3 mounted on a leadframe 2. The leadframe is in thermal contact with a heatsink 1. A first terminal of the power switch is denoted by D. The terminal D is routed to the exterior via a wire link from the chip 3. As is shown in the circuit diagram, the first terminal D is connected to a load 4. Since the power switch 6 in FIG. 1 is illustrated as a low-side switch, the "active" potential is applied to the terminal D.

A second terminal of the transistor 6 is denoted by S. In the illustrated embodiment, this is permanently connected to the leadframe 2 and is thus at the "inactive" potential.

The power switch furthermore comprises a gate terminal G. A control voltage is applied to the gate and is used to vary the current flowing through the transistor between the source S and the drain D.

The circuit is supplied from a voltage source 5, which is protected by filter capacitors 7.

The illustrated transistor configuration with the source S at the inactive potential and the load 4 in the drain path avoids interference being coupled into the frame line.

To allow the transistor 6 to be suppressed or decoupled according to the invention, it must be manufactured such that the source S of the transistor can be connected to the leadframe 2.

In a first embodiment, a DMOS transistor is used as a switching element for this purpose, and is manufactured using smart-power technology. DMOS transistors using this technology are always insulated from the rear side of the silicon wafer or chip 3, that is to say both the drain D and the source S can be connected as required, with the source S being connected to the leadframe 2 via a non-illustrated wire link.

In order to achieve even greater switching power levels than with DMOS transistors manufacturing using smart-power technology, the chips 3 in a further embodiment of the invention are mounted with DMOS transistors "inverted" on the leadframe 2. In other words, the chip 3 with DMOS transistors of the conventional type is mounted on the leadframe via the source S. The source S is thus located between the chip 3 and the leadframe 2 and is connected via the leadframe 2. The drain D is located at the top on the chip 3, and is directly accessible.

Figure 4:
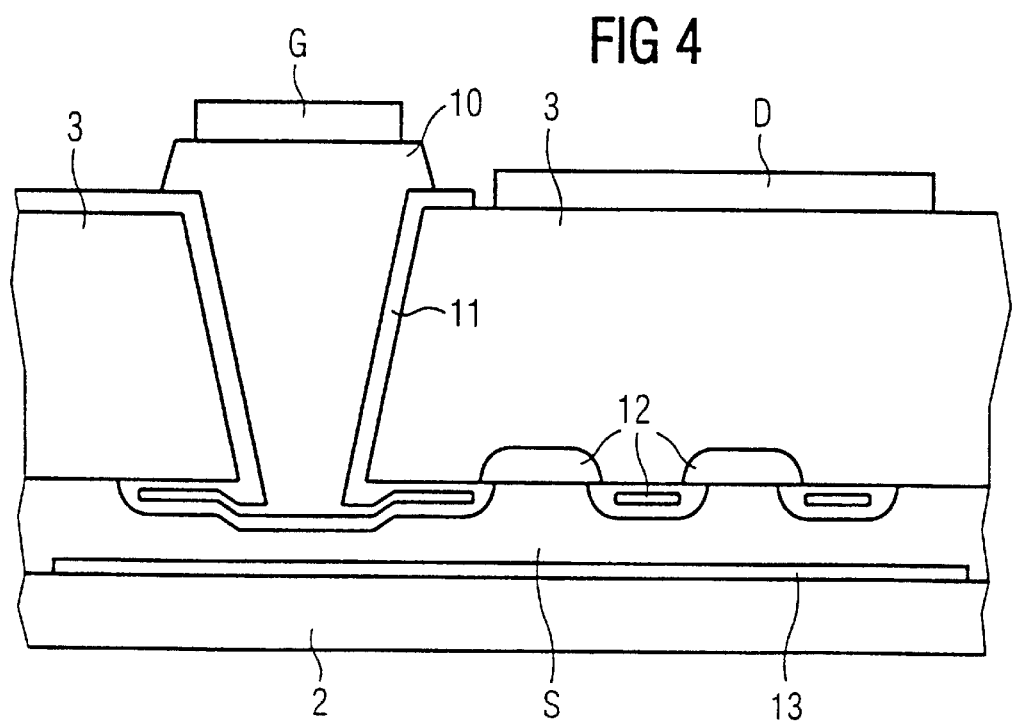
FIG. 4 is a diagrammatic sectional view through a transistor in one embodiment of the invention.

The gate terminal G of the transistor is located in the immediate vicinity of the source terminal S. The gate terminal is thus no longer directly accessible via the source S when the chip 3 is mounted on the leadframe 2. In the preferred embodiment, with the chip 3 mounted via the source S, the gate terminal G is thus moved from the front side, that is to say the source side S, to the rear side, that is to say the drain side. A terminal is preferably made from the front side of the chip 3 to the rear side of the chip 3 via trenches in the chip. Thin chip wafers are thus preferably used for this embodiment of the power switch according to the invention. The depth of the trenches in the chip 3 is chosen to correspond to the thickness of the chip wafers. FIG. 4 shows one embodiment of the invention with trenches in the transistor for the gate G.

With reference to FIG. 4, the trench 10 has an insulation layer 11. Various transistor structures 12 are formed on the underside of the chip 3. The chip 3 and the leadframe 2 are connected via a solder joint 13.

The two embodiments of the invention above differ in that the chip 3 is thus either completely insulated from the leadframe 2 and thus from the heatsink and the terminal between the source and the leadframe is a wire link, or the chip 3 is mounted via the source S on the leadframe 2 in such a manner that the drain D is located on the exposed surface of the chip 3.

In a further embodiment of the invention, the chips 3 are configured as transistors in which the rear side of the chip facing the leadframe forms the source terminal. A direct terminal can thus be produced between the source S and the leadframe 2 and heatsink 1. Since the source S is at the inactive potential, the leadframe 2 is thus also brought to the inactive potential, according to the invention.

In all three cases, the chip can be soldered on a leadframe, and the leadframe can be connected directly to the intermediate circuit potential, in the conventional manner. This avoids—as described above—interference propagating to frame/ground. No interference current occurs since there is no potential change on the coupling capacitance between the leadframe and frame, that is to say dU/dt=0. The coupling capacitance $C_K^*$ which remains at the drain terminal of the component is much less than $C_K$, so that interference $I_{int}$ is very largely avoided.

The invention thus provides an EMC-optimized transistor, with which it is possible to achieve better suppression of external lines than in the case of transistors according to the prior art. In particular, the invention can be used for low-side switches. In all low-side switches, that is to say switches in which the load 4 is connected in the drain circuit, the inactive potential is the source potential. The terminal of the leadframe 2 to the source S so that the potential of the leadframe 2 is thus inactive with respect to frame and dU/dt=0 in consequence prevents any interference current from being coupled outward into the frame terminal. This is true irrespective of the coupling capacitance between the chip 3 and the heatsink 1. No interference current is coupled to the frame even if the chip is conductively mounted directly on a heatsink 1 connected to frame. In this case, the low-side switches may also be used in bridge circuits.

Figure 3:
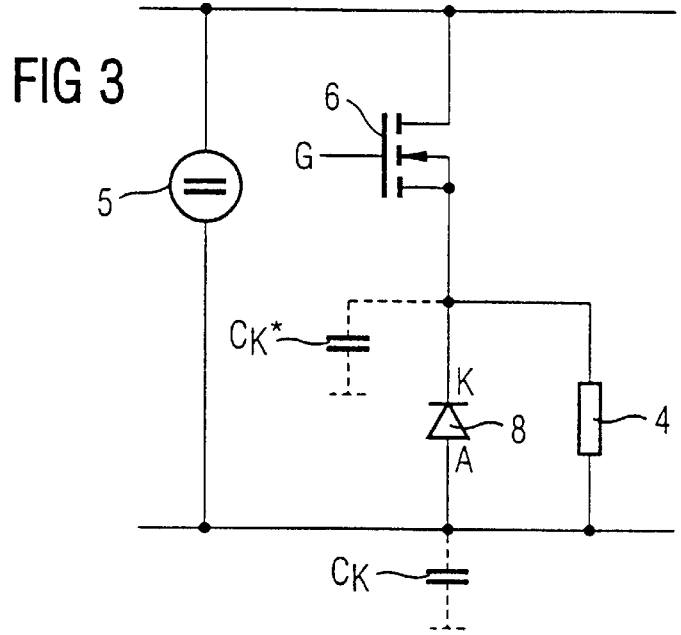
FIG. 3 is a schematic of a further embodiment of the shielded power switch according to the invention.

FIG. 3 shows a further example for a circuit of a component according to the invention. In that case, the power switch is a diode 8 with a cathode K as the first terminal, and an anode A as the second terminal. It is connected in series with the (conventional) transistor 6 and, in the illustrated circuit, is used as a freewheeling diode. With regard to the anode A, which is connected to the leadframe, and the cathode K, which is located on the top face of the chip, the anode A is at the inactive potential and, in consequence, no interference current is any longer coupled into the frame circuit via the large capacitance $C_K$ of the component. Only the very much smaller capacitance $C_K^*$ between the cathode and the heatsink is at a potential which varies with time. However, since the capacitance $C_K^*$ of the cathode is very small, any coupling of interference currents into the frame circuit is reliably suppressed.

The invention has been described with reference to MOS transistors and diodes. It will be understood, however, by those skilled in the pertinent art, that the invention is equally applicable to bipolar semiconductor components such as bipolar transistors, IGBTs, all types of thyristors, and equivalent structures.

We claim:

1. A power switch, comprising:

a leadframe;

a semiconductor chip on said leadframe; and a transistor formed on said semiconductor chip, said transistor having a drain forming a first terminal for an active potential and having a source forming a second terminal connected to said leadframe for an inactive potential.

2. The power switch according to claim 1, wherein said transistor has said source and said semiconductor chip is mounted on said leadframe via said source.

3. The power switch according to claim 2, wherein said semiconductor chip has an exposed surface and trenches formed therein, and wherein said transistor has a gate terminal connected to said exposed surface of said semiconductor chip via said trenches in said semiconductor chip.

4. A power switch, comprising:

a leadframe;

a semiconductor chip on said leadframe; and a diode formed on said semiconductor chip, said diode having a cathode forming a first terminal for an active potential and an anode connected to said leadframe for an inactive potential.

* * * * *